(12) United States Patent
Wu et al.

(10) Patent No.: US 8,124,522 B1
(45) Date of Patent: Feb. 28, 2012

(54) REDUCING UV AND DIELECTRIC DIFFUSION BARRIER INTERACTION THROUGH THE MODULATION OF OPTICAL PROPERTIES

(75) Inventors: Hui-Jung Wu, Fremont, CA (US); Kimberly Shafi, Boise, ID (US); Kaushik Chattopadhyay, San Jose, ID (US); Keith Fox, Portland, OR (US); Tom Mountsier, San Jose, CA (US); Girish Dixit, San Jose, CA (US); Bart van Schravendijk, Sunnyvale, CA (US); Elizabeth Apen, West Linn, OR (US)

(73) Assignee: Novellus Systems, Inc., San Jose, CA (US)

( * ) Notice: Subject to any disclaimer, the term of this patent is extended or adjusted under 35 U.S.C. 154(b) by 637 days.

(21) Appl. No.: 12/082,496

(22) Filed: Apr. 11, 2008

(51) Int. Cl.
*H01L 23/532* (2006.01)
*H01L 21/768* (2006.01)

(52) U.S. Cl. ........ 438/618; 438/378; 438/795; 438/796; 438/797; 438/687

(58) Field of Classification Search .................. 438/378, 438/795, 796, 797
See application file for complete search history.

(56) References Cited

U.S. PATENT DOCUMENTS 4,656,110 A    4/1987   Yamazaki
(Continued)

OTHER PUBLICATIONS

Masahiko Maeda, et al., "A Low-Permittivity Interconnection Using an SiBN Interlayer", Sep. 1989, IEEE Transactions on Electron Devices, vol. 36, No. 9.

(Continued)

*Primary Examiner* — Jerome Jackson, Jr.
*Assistant Examiner* — David Spalla
(74) *Attorney, Agent, or Firm* — Weaver Austin Villeneuve & Sampson LLP (57) ABSTRACT

Provided are methods of stabilizing an underlying dielectric diffusion barrier during deposition and ultraviolet (UV) processing of an overlying dielectric layer. Methods include modulating the optical properties reduces the effects of UV radiation on the dielectric diffusion barrier layer. The dielectric diffusion barrier can be made to absorb less UV radiation. A dielectric layer with UV absorbing properties may also be added on top of the diffusion barrier layer so less UV is transmitted. Both methods result in reduced interaction between UV radiation and the dielectric diffusion barrier.

10 Claims, 5 Drawing Sheets

U.S. PATENT DOCUMENTS

| | | | |
|---|---|---|---|
| 5,034,355 A | 7/1991 | Tani et al. | |
| 5,108,965 A | 4/1992 | Tani et al. | |
| 5,324,690 A | 6/1994 | Gelatos et al. | |
| 5,464,699 A | 11/1995 | Baldi | |
| 5,654,208 A | 8/1997 | Harris et al. | |
| 5,739,579 A | 4/1998 | Chiang et al. | |
| 5,958,324 A | 9/1999 | Bujalski et al. | |
| 6,045,877 A | 4/2000 | Gleason et al. | |
| 6,100,587 A | 8/2000 | Merchant et al. | |
| 6,150,719 A | 11/2000 | Saia et al. | |
| 6,159,871 A | 12/2000 | Loboda et al. | |
| 6,197,688 B1 | 3/2001 | Simpson | |
| 6,242,686 B1 | 6/2001 | Kishimoto et al. | |
| 6,352,945 B1 | 3/2002 | Matsuki | |
| 6,383,898 B1 | 5/2002 | Kishimoto et al. | |
| 6,383,955 B1 | 5/2002 | Matsuki | |
| 6,399,484 B1 | 6/2002 | Yamasaki et al. | |
| 6,410,419 B1 | 6/2002 | Merchant et al. | |
| 6,417,092 B1 | 7/2002 | Jain et al. | |
| 6,424,044 B1 | 7/2002 | Han et al. | |
| 6,432,846 B1 | 8/2002 | Matsuki | |
| 6,455,409 B1 | 9/2002 | Subramanian et al. | |
| 6,465,372 B1 | 10/2002 | Xia et al. | |
| 6,506,692 B2 | 1/2003 | Andideh | |
| 6,670,715 B2 | 12/2003 | Yang et al. | |
| 6,764,958 B1 | 7/2004 | Nemani et al. | |
| 6,774,489 B2 | 8/2004 | Russell et al. | |
| 6,790,767 B2 | 9/2004 | Lee | |
| 6,790,788 B2 | 9/2004 | Li et al. | |
| 6,855,645 B2 | 2/2005 | Tang et al. | |
| 6,881,683 B2 | 4/2005 | Matsuki et al. | |
| 6,890,850 B2 | 5/2005 | Lee et al. | |
| 6,930,013 B2 | 8/2005 | Choi et al. | |
| 6,967,405 B1 | 11/2005 | Yu et al. | |
| 7,064,088 B2 | 6/2006 | Hyodo et al. | |
| 7,091,137 B2 | 8/2006 | Lee et al. | |
| 7,115,534 B2 | 10/2006 | Nguyen et al. | |
| 7,163,889 B2 | 1/2007 | Yu et al. | |
| 7,239,017 B1 | 7/2007 | Yu et al. | |
| 7,253,125 B1* | 8/2007 | Bandyopadhyay et al. | 438/795 |
| 7,282,438 B1 | 10/2007 | Yu et al. | |
| 7,381,662 B1* | 6/2008 | Niu et al. | 438/795 |
| 7,420,275 B1 | 9/2008 | Yu et al. | |
| 7,468,290 B2* | 12/2008 | Lukas et al. | 438/99 |
| 7,573,061 B1 | 8/2009 | Yu et al. | |
| 7,842,604 B1 | 11/2010 | Yu et al. | |
| 7,915,166 B1 | 3/2011 | Yu et al. | |
| 7,923,385 B2* | 4/2011 | Wu et al. | 438/789 |
| 2001/0021491 A1 | 9/2001 | Chen et al. | |
| 2002/0019148 A1* | 2/2002 | Hawryluk et al. | 438/795 |
| 2003/0001275 A1 | 1/2003 | Sambucetti et al. | |
| 2003/0049460 A1 | 3/2003 | O'Neil et al. | |
| 2003/0057553 A1 | 3/2003 | DelaRosa et al. | |
| 2003/0068881 A1 | 4/2003 | Xia et al. | |
| 2003/0082296 A1 | 5/2003 | Elers et al. | |
| 2003/0089992 A1 | 5/2003 | Rathi et al. | |
| 2003/0162033 A1* | 8/2003 | Johnson et al. | 428/426 |
| 2003/0194496 A1 | 10/2003 | Xu et al. | |
| 2003/0232150 A1 | 12/2003 | Arnold et al. | |
| 2003/0232514 A1 | 12/2003 | Kim et al. | |
| 2004/0067308 A1 | 4/2004 | Zheng et al. | |
| 2004/0084774 A1 | 5/2004 | Li et al. | |
| 2004/0113279 A1 | 6/2004 | Chen et al. | |
| 2004/0124531 A1 | 7/2004 | Venkatraman et al. | |
| 2004/0207084 A1 | 10/2004 | Hedrick et al. | |
| 2005/0014361 A1 | 1/2005 | Nguyen et al. | |
| 2005/0042889 A1 | 2/2005 | Lee et al. | |
| 2005/0202685 A1 | 9/2005 | Huang et al. | |
| 2005/0233555 A1 | 10/2005 | Rajagopalan et al. | |
| 2005/0236711 A1 | 10/2005 | Wang et al. | |
| 2005/0245071 A1 | 11/2005 | Wu et al. | |
| 2005/0277302 A1 | 12/2005 | Nguyen et al. | |
| 2006/0019486 A1 | 1/2006 | Yu et al. | |
| 2006/0110931 A1 | 5/2006 | Fukazawa et al. | |
| 2007/0166546 A1 | 7/2007 | Ichikawa et al. | |
| 2007/0281497 A1 | 12/2007 | Liu et al. | |
| 2008/0050933 A1* | 2/2008 | Ozaki et al. | 438/788 |
| 2008/0063809 A1 | 3/2008 | Lee et al. | |
| 2008/0070396 A1 | 3/2008 | Budrevich et al. | |
| 2008/0122103 A1* | 5/2008 | Bonilla et al. | 257/767 |
| 2008/0128907 A1 | 6/2008 | Yang et al. | |
| 2008/0173984 A1* | 7/2008 | Lin et al. | 257/639 |
| 2008/0254641 A1 | 10/2008 | Kobayashi et al. | |
| 2009/0215282 A1* | 8/2009 | Moore et al. | 438/795 |
| 2009/0294925 A1* | 12/2009 | Lin et al. | 257/635 |
| 2011/0111590 A1* | 5/2011 | Edelstein et al. | 438/643 |

OTHER PUBLICATIONS

Takashi Sugino, et al., "Synthesis of boron nitride film with low dielectric constant for its application to silicon ultralarge scale integrated semiconductors", 2001 Elsevier Science B.V., Diamond and Related Materials 1275-1379.

Qingguo (Gordon) Wu et al., "Ultra Low k Dielectrics Prepared by PECVD Using a Single-Precursor and Treated by UV Assisted Thermal Processing", Oct. 17-19, 2006, Advanced Metallization Conference (AMC) 2006, San Diego, CA, pp. 1-6.

U.S. Office Action mailed Feb. 24, 2005, from U.S. Appl. No. 10/670,660.

U.S. Office Action mailed May 3, 2006, from U.S. Appl. No. 10/915,117.

U.S. Office Action mailed Sep. 6, 2006, from U.S. Appl. No. 10/869,474.

U.S. Office Action mailed Sep. 7, 2006, from U.S. Appl. No. 10/915,117.

U.S. Office Action mailed Dec. 11, 2006, from U.S. Appl. No. 10/915,117.

U.S. Office Action mailed Feb. 9, 2007, from U.S. Appl. No. 10/869,474.

Final Office Action, Mailed Jun. 28, 2007, Yu et al., "Low-K SIC Copper Diffusion Barrier Films", U.S. Appl. No. 10/869,474.

Notice of Allowance, Mailed Jul. 26, 2007, Yu et al., "Low-K SIC Copper Diffusion Barrier Films", U.S. Appl. No. 10/869,474.

U.S. Office Action mailed Mar. 17, 2008, U.S. Appl. No. 11/893,490.
U.S. Office Action mailed Aug. 8, 2008, U.S. Appl. No. 11/893,490.
U.S. Office Action mailed May 1, 2008, U.S. Appl. No. 11/373,847.
U.S. Office Action mailed Dec. 31, 2008, U.S. Appl. No. 11/693,617.
U.S. Office Action mailed Apr. 10, 2009, U.S. Appl. No. 11/805,356.
Notice of Allowance for U.S. Appl. No. 11/893,490 mailed May 4, 2009.
Allowed Claims for U.S. Appl. No. 11/893,490.
U.S. Office Action mailed Aug. 28, 2009, U.S. Appl. No. 11/693,661.
U.S. Office Action mailed Oct. 7, 2009, U.S. Appl. No. 11/693,617.
U.S. Final Office Action mailed Oct. 13, 2009, U.S. Appl. No. 11/805,356.
U.S. Office Action mailed Nov. 20, 2009, U.S. Appl. No. 11/710,652.
U.S. Office Action mailed Feb. 24, 2010, U.S. Appl. No. 11/693,661.
U.S. Office Action mailed Apr. 8, 2010, U.S. Appl. No. 11/805,356.
U.S. Final Office Action mailed Apr. 15, 2010, U.S. Appl. No. 11/710,652.
U.S. Office Action mailed Jun. 10, 2010, U.S. Appl. No. 11/693,617.
Notice of Allowance and Allowed Claims for U.S. Appl. No. 11/805,356 mailed Jul. 26, 2010.
U.S. Office Action mailed Aug. 5, 2010, U.S. Appl. No. 11/710,652.
Rangarajan et al., "Hardmask Materials", Novellus Systems, Inc., U.S. Appl. No. 12/631,691, filed Dec. 4, 2009.
U.S. Office Action mailed Oct. 15, 2010 for U.S. Appl. No. 12/497,322.
U.S. Final Office Action for U.S. Appl. No. 11/693,661 mailed Nov. 5, 2010.
Notice of Allowance and Allowed Claims for U.S. Appl. No. 11/710,652, mailed Nov. 24, 2010.
U.S. Final Office Action mailed Jan. 20, 2011, U.S. Appl. No. 11/693,617.
U.S. Notice of Allowance mailed Mar. 11, 2011 for U.S. Appl. No. 12/497,322.
Allowed Claims as of Mar. 11, 2011 for U.S. Appl. No. 12/497,322.
Yu et al., "Improved Diffusion Barrier and Etch Stop Films", U.S. Appl. No. 13/032,392, filed Feb. 22, 2011.

\* cited by examiner

REDUCING UV AND DIELECTRIC DIFFUSION BARRIER INTERACTION THROUGH THE MODULATION OF OPTICAL PROPERTIES

FIELD OF THE INVENTION

This invention relates to methods for reducing UV and dielectric diffusion barrier interaction. The invention also relates to methods of forming dielectric diffusion barrier layers suitable for integration in a wide range of VLSI and ULSI fabrication operations.

BACKGROUND OF THE INVENTION

There is a general need for materials with low dielectric constants (low-k) in the integrated circuit manufacturing industry. Using low-k materials as the interlayer dielectric (ILD) of conductive interconnects reduces the delay in signal propagation and signal crosstalk due to capacitive effects. The lower the dielectric constant of the dielectric, the lower the capacitance of the dielectric and the RC delay in the lines and signal crosstalk between electrical lines of the integrated circuit (IC). Further, the use of a low-k material as an interlayer dielectric reduces the power consumption of complex integrated circuits.

Low dielectric constant (k) ("low-k"), insulators, with k significantly lower than that of $SiO_2$ (3.9), are now used as inter-layer dielectric, e.g., as inter-metal dielectric (IMD) for reducing capacitive coupling and improving switching performance of integrated circuits (IC). For example, porous carbon doped silicon dioxide provides a dielectric constant of less than about 3.0.

Cu/IMD integration schemes typically involve the incorporation of other materials along with the bulk inter-metal dielectric material, forming a stack. These other materials may include copper diffusion barrier, copper capping layer and etch stop materials needed to prevent copper poisoning of the bulk low-k dielectric, to protect the relatively soft low-k dielectric, and to facilitate the damascene processing used in the device fabrication. These materials have a substantial impact on the effective k of the IMD stack. For example, an etch stop layer having a higher dielectric constant than the insulating IMD material proximate to it increases the overall (effective) k of the IMD stack. Thus, materials used for etch stop, barrier and capping layers must meet the dual challenges of minimizing the effective k of the stack while providing etch selectivity and protection for the IMD layers.

Barrier and etch stop layers should not only possess a low dielectric constant, but should preferably meet a number of integration requirements. These requirements relate to stability of these layers, their mechanical strength, their stress characteristics and their electrical performance. To meet integration requirements, the chemical, mechanical and electrical characteristics of the barrier and etch stop layers must stay within a certain range. These properties should remain stable while the layers are exposed to ambient conditions after deposition, during subsequent processing, and also during working conditions as part of an IC device. For mechanical strength, integration requires these layers to have high modulus and hardness values, which is correlated to etch selectivity. Films having compressive stress are preferred, because these films can provide mechanical integrity of the interconnect films stack. Lastly, good electrical performance is also required, with leakage currents and breakdown voltage parameters comparable to those of nearby dielectric layers.

There is currently a need for methods to form diffusion barrier layers that would maintain integration requirements relating to stability, mechanical strength and line-to-line leakage. Improved materials and processing are required.

SUMMARY

Stability of an underlying dielectric diffusion barrier during deposition and ultraviolet (UV) processing of an overlying dielectric layer is critical for successful integration. Modulating the optical properties reduces the effects of UV radiation on the dielectric diffusion barrier layer. The dielectric diffusion barrier can be made to absorb less UV radiation. A dielectric layer with UV absorbing or reflecting properties may also be added on top of the diffusion barrier layer so less UV is transmitted. Both methods result in reduced interaction between UV radiation and the dielectric diffusion barrier.

The present invention is directed to a semiconductor processing method for forming layers of dielectric material. A dielectric diffusion barrier film that does not substantially absorb UV radiation is provided in a substrate. A dielectric film is deposited on the barrier film and treated with UV radiation that alters the properties of the dielectric film, but does not substantially alter the dielectric diffusion barrier film properties. A substantial alteration of the barrier film properties is one that would adversely impact the yield and quality of the IC device. A substantial alteration of the diffusion barrier film properties may affect the adhesion between the diffusion barrier layer and the copper or between the diffusion barrier and the overlying dielectric layer. In particular embodiments, the diffusion barrier film stress may not change by more than 50 MPa. In other embodiments, the diffusion barrier film stress may not change from compressive to tensile.

A diffusion barrier film that does not substantially absorb UV radiation may be SiNC, SiBC, SiOC, SiBN, SiC, or SiN. The diffusion barrier film may be designed to have a lower extinction coefficient than a conventional copper barrier film. A reduction in extinction coefficient (k(extinct)) reduces the percentage of UV radiation the diffusion barrier film absorbs. In some embodiments, a diffusion barrier film with lower k(extinct) is created by depositing the film without using low frequency radio frequency (LFRF) power to bias the pedestal supporting the substrate on which the film is deposited. The diffusion barrier film thus created absorbs less UV radiation and is therefore less adversely affected by it.

In other embodiments, the diffusion barrier layer is capped with another dielectric layer that does not substantially transmit UV radiation. The capping layer may be a highly reflective layer such that most of the UV radiation is reflected back to the overlying dielectric layer and no substantial amount of the UV radiation is transmitted to the diffusion barrier layer. The capping layer may also be a highly absorbing layer such that at least half of the UV radiation is absorbed in the capping layer and is neither transmitted to the diffusion barrier layer nor reflected. Examples of absorbing capping layers may be silicon-rich oxide (SRO), SiON, SiN, or $TiO_2$.

The highly reflective layer may comprise one or more layers. By choosing materials of appropriate refractive indexes in layers and having layer thicknesses of about one quarter of the wavelength of incident light, the various reflected wavefronts can be made to the interfere constructively. Because the UV radiation typically used in semiconductor processing comprise a range, a number of layers at different one-quarter thicknesses may be useful to reflect UV radiation having a range of wavelengths. Preferably, a monochromatic or semi-monochromatic UV radiation source is used to reduce the number of layers required.

In particular embodiments, the highly reflective layer consists of a dielectric film layer having a refractive index of 2.5 or above. The greater the difference between refractive indexes of alternating layers, the more reflective is the layer. UV radiation in a narrower range, such as that from a semi-monochromatic source, applied to the overlying dielectric layer to facilitate certain effects such as cross-linking may be reflected from the bottom interface exactly one wavelength apart from that reflected from the top interface.

These and other features and advantages of the present invention will be described in more detail below with reference to the associated drawings.

DETAILED DESCRIPTION OF SPECIFC EMBODIMENTS

Introduction and Overview

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

Stability of an underlying dielectric diffusion barrier during deposition and ultraviolet (UV) processing of an overlying dielectric layer is critical for successful integration. Modulating the optical properties reduces the effects of UV radiation on the dielectric diffusion barrier layer. The dielectric diffusion barrier can be made to absorb less UV radiation. Alternatively, or in addition, a dielectric layer with UV absorbing or reflecting properties may be added on top of the diffusion barrier layer so less UV is transmitted. Both methods result in reduced interaction between UV radiation and the dielectric diffusion barrier.

An overlying dielectric layer may be treated with UV radiation, for example for porogen removal and hardening of the porous PECVD ULK film. UV curing is used to drive out porogen from composite porogen-OSG films, leaving a porous OSG matrix with a low-k-value, generally between 2.0 and 2.6. The dielectric films are prepared from precursor films or layers that contain a structure former that serves as a backbone of a porous network, and a porogen, which generates the porous regions within the porous network. The methods involve a multiple operation UV cure process in which porogen is removed in an initial exposure (or exposures) to UV radiation to form a porous dielectric film. This operation tends to make the film softer. Once the porogen is removed, the film is exposed to UV radiation to increase cross-linking within the film, thereby increasing the hardness. The UV exposure characteristics of these operations are different so as to accomplish different effects on the film.

The thickness of the precursor film (and hence the resulting dielectric layer) depends upon the ultimate application. For an interlayer dielectric or packaging application, the thickness may range from 100 angstroms up to about 2 to 3 microns. In some cases, extra thickness is required to provide some amount of sacrificial dielectric to accommodate a subsequent planarization operation. In some cases, the thickness of the overlying dielectric layer may be driven in part by the ability of the UV radiation to penetrate the film and remove the porogen. Therefore relatively thinner layers may be required for some processes.

Another example of treating an overlying dielectric film with UV radiation is fluorosilicate glass (FSG). FSG film may be treated with UV radiation to improve stability. UV exposure removes the loosely bound fluorine and/or the silanol that is formed from the exposure of an unstable FSG film to moisture. The UV exposure may also remove other defects in the SiOF film, such as Si—H and dangling (unsatisfied) bonds. It is believed that UV exposure also results in cross-linking in the Si—O matrix, further enhancing the film's stability.

During UV treatment of the overlying dielectric film, the underlying dielectric diffusion barrier film is also exposed to UV radiation. The amount of UV radiation transmitted is a function of the optical properties of the overlying dielectric layer and the diffusion barrier layer. The UV radiation may be absorbed, reflected, or transmitted by the overlying dielectric layer.

Absorption of UV radiation by the overlying dielectric layer is preferred. Absorption of the UV radiation effects the property change that the exposure is intended to create, such as porogen removal, cross-linking, strengthening, and improving stability. Absorption is a function of the optical properties and the thickness of the film, particularly the extinction coefficient, k(extinct), which is the imaginary part of the index of refraction, and the thickness of the film. The complex index of refraction can be represented by n+ik, where n is the refractive index and k is the extinction coefficient. In general, thicker films and higher k(extinct) absorb more radiation.

The relationship between the intensity of radiation transmitted and the initial light intensity through a solid can be expressed as a modified form of Beer's Law, also known as Bouguer's law.

$$I = I_0 e^{-\alpha z} \quad \alpha = \frac{4\pi k}{\lambda}$$

Figure 1:
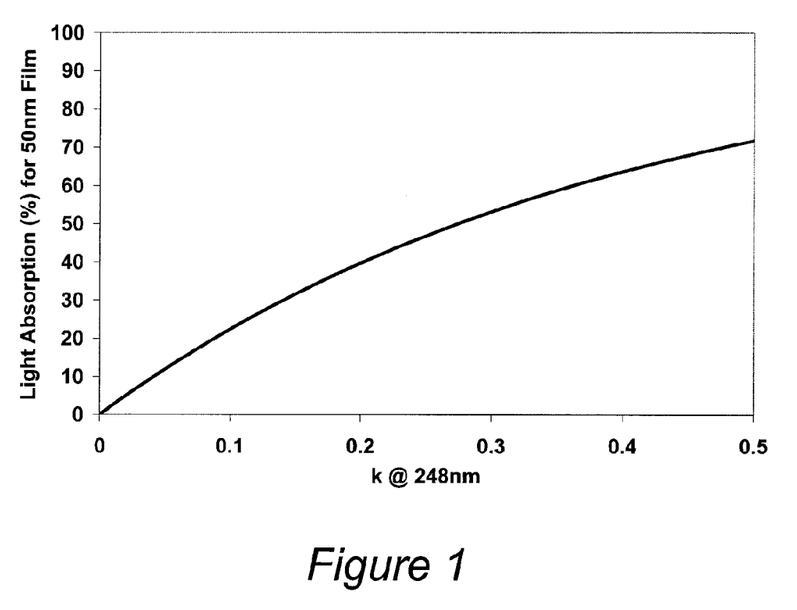
FIG. 1 illustrates the light absorption percentage for a hypothetical 50 nm film at different extinction coefficients.
Figure 2:
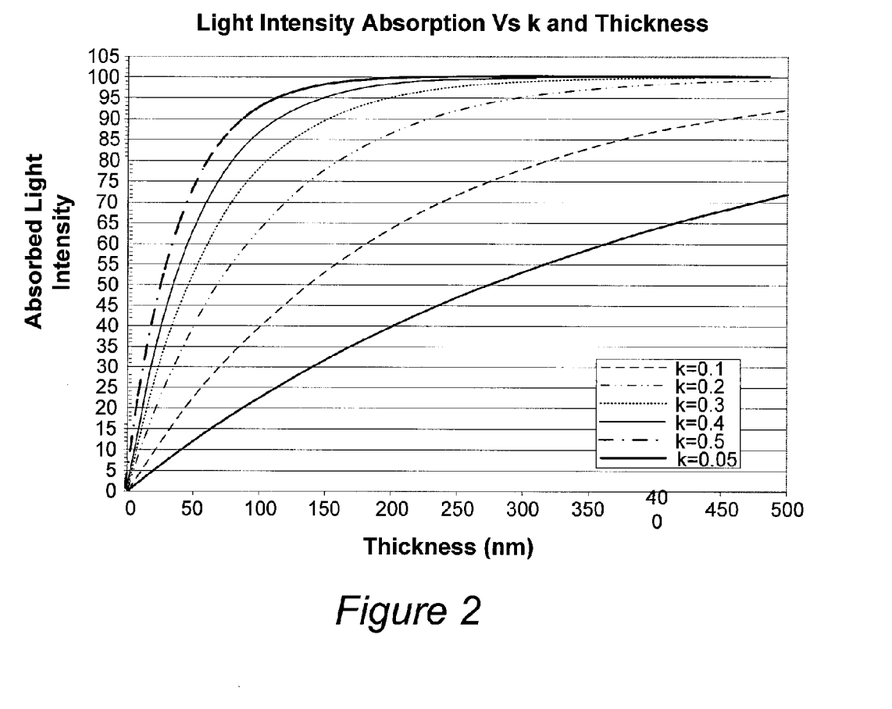
FIG. 2 illustrates the light absorption percentage at different thicknesses for films having different extinction coefficients.

Equation 1
  I=light intensity
  $I_o$=initial light intensity
  z=propagation depth
  α=absorption coefficient
  λ=wavelength
  k=extinction coefficient The absorption, or the percentage of radiation not transmitted, is $(I_o-I)/I_o$. FIG. 1 shows a graph of light absorption percentage for a 50 nm film having a range of k(extinct) values from 0 to 0.5. As k(extinct) goes up, more light is absorbed. FIG. 2 shows a graph of light absorption percentages for various film shaving different k(extinct) values from 0.05 to 0.5 as a function of film thickness. As film thickness increases, the amount of radiation absorbed increases. The rate of increase slows for k(extinct) above 0.2, such that thicker film does not absorb more incrementally. Another way to look at this relationship is to calculate the thickness required to absorb 50% of the UV radiation for different extinction coefficients.

TABLE 1

Thickness in nm Required to Absorb 50% of UV Intensity

| k @ 248 nm for Cap | 0.1 | 0.2 | 0.3 | 0.4 | 0.5 |
|---|---|---|---|---|---|
| Th required to Absorb 50% UV Intensity (nm) | 140 | 70 | 45 | 35 | 25 |

The UV radiation that is not absorbed by the overlying dielectric layer is transmitted to the diffusion barrier layer below. The UV radiation can interact strongly with the underlying dielectric diffusion barrier film. UV radiation is known to increase dielectric diffusion barrier film tensile stress. It is believed that UV radiation breaks Si—H and Si—OH, N—H bonds and allows the hydrogen groups to diffuse out of the film. The presence of bonded hydrogen in the film has been recognized as the major source of compressive residual stress. The presence of hydrogen reduces the nominal spacing between the molecules and generates compressive stress. When the hydrogen is removed, the spacing between the molecules is increased and the film becomes more tensile. As a result, the film stress shifts.

A stress shift from compressive to tensile for the dielectric diffusion barrier films can lead to reliability issues. The dielectric diffusion barrier film is a part of a film stack: for example, in a damascene structure, copper interconnect layers in trenches and vias surrounded by another dielectric film below; and a dielectric barrier film on top. A stress shift may affect the adhesion between copper and the dielectric diffusion barrier layer or the other dielectric layer and the diffusion barrier layer. If the adhesion at either interface becomes weak, the diffusion barrier layer can delaminate from the rest of the film stack.

The present invention is directed to modulating the optical properties within the film stack to avoid the unwanted interaction between the UV radiation and the diffusion barrier layer. In one embodiment, the diffusion barrier layer is designed to have a low extinction coefficient such that the percentage of UV radiation absorbed by the diffusion barrier layer is reduced. In addition to modulating the optical properties of the diffusion barrier layer, an additional layer with specific optical properties may be added in accordance with the present invention. In particular embodiments, the diffusion barrier layer is capped with another dielectric layer that does not substantially transmit UV radiation. Substantial transmission is defined to be the amount that would alter the diffusion barrier layer film properties such that the yield and quality of the IC device would be adversely impacted.

The capping layer may be a highly reflective layer such that the UV radiation is reflected back into the overlying dielectric layer without substantial transmission to the diffusion barrier layer below. The capping layer may also be a highly absorbing layer with a high extinction coefficient such that the UV radiation is absorbed instead of being transmitted. Of course, the capping layer may be both reflective and absorbing, to minimize the amount of UV radiation transmitted. One or more capping layers may be used of different thicknesses or refractive indices to reduce the radiation transmitted.

The Copper Damascene Process

Film stacks are created with damascene processing, which is a method for forming interconnections on integrated circuits. It involves formation of inlaid metal lines in trenches and vias formed in a dielectric layer (inter-metal dielectric).

In order to frame the discussion of this invention, a copper dual damascene process for forming a partially fabricated integrated circuit is described below. Although damascene processing is used here to frame the discussion, the present invention can be applied to other processes where the UV radiation effects may be reduced by modulating optical properties of films in the stack.

Figure 3A:
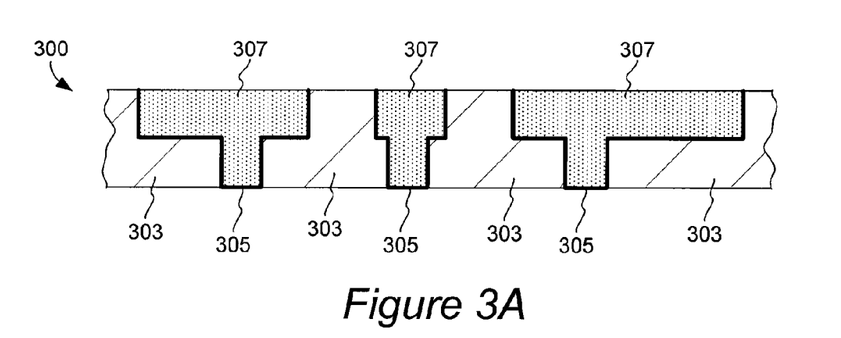
FIGS. 3A-3E show cross sectional depictions of device structures created during a copper dual damascene fabrication process.

Presented in FIGS. 3A-3E, is a cross sectional depiction of device structures created on a semiconductor substrate at various stages of a dual damascene fabrication process. "Semiconductor substrate" as used in this application is not limited to the semiconductor portions of an IC device, but is broadly defined as a semiconductor-containing substrate, which includes IC structures (e.g., conductors and insulators) residing upon semiconductor material. Referring to FIG. 3A, an example of a typical partially fabricated IC structure, 300, used for dual damascene fabrication is illustrated. Structure 300 may directly reside on a semiconductor layer containing active devices, such as transistors. It may directly reside on a metallization layer or other layers that incorporate conductive materials, e.g. layers containing memory capacitors.

A layer 303 illustrated in FIG. 3A is a layer of inter-metal dielectric, which may be silicon dioxide but is more typically a low-k dielectric material. In order to minimize the dielectric constant of the IMD stack, materials with a k value of less than about 3.5, preferably less than about 3.0 and often as low as about 2.5 are employed as inter-layer dielectrics. These materials include but are not limited to fluorine or carbon doped silicon dioxide, organic-containing low-k materials and porous doped silicon dioxide materials known to those of skill in the art. Layer 303 is etched with line paths (trenches and vias) in which a metal diffusion barrier 305 is deposited followed by inlaying with copper conductive routes 307.

Because copper or other mobile conductive material provides the conductive paths of the semiconductor substrate, the underlying silicon devices and dielectric layers proximate to metal lines must be protected from metal ions (e.g., $Cu^{2+}$) that might otherwise diffuse or drift into the silicon or ILD and result in degradation of their properties. Diffusion barriers may be divided into partially conductive metal-containing layers such as 305 and non-conductive barrier layers which will be described in further detail with reference to FIG. 3B. Suitable materials for partially conductive diffusion barrier 305 include materials, such as tantalum, tantalum nitride and other materials known to those of skill in the art.

Figure 3B:
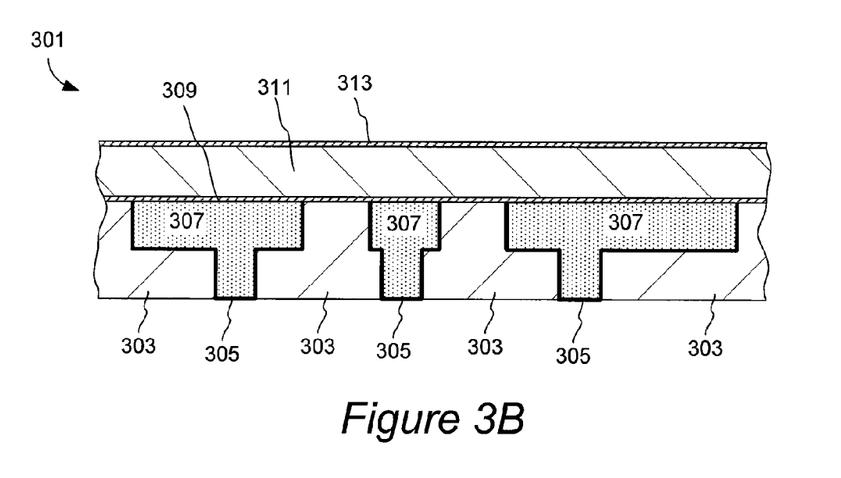

As depicted in FIG. 3B, a diffusion barrier 309 is deposited to encapsulate conductive routes 307. This layer may also serve as an etch stop during subsequent damascene processing. In contrast to partially conductive barrier 305, layer 309 should be non-conductive and should preferably have a low dielectric constant. Preferably materials with a dielectric constant of less than about 5.0, e.g., with a dielectric constant of 3.5-5 should be used. At the same time this layer should be mechanically strong and should be capable of protecting the underlying dielectric layer, which is often made of a soft and unstable material and it easily absorbs moisture. Layer 309 should also effectively prevent diffusion of metal into the dielectric layer and should provide etch selectivity when used as an etch stop. Layer 309 may be SiNC, SiBC, SiOC, SiBN, SiC, or SiN; and may be, for example, 100-1500 angstroms thick. These materials can be deposited on a semiconductor substrate having exposed layers of dielectric and exposed metal lines by a number of methods, including plasma enhanced chemical vapor deposition (PECVD), chemical vapor deposition, such as thermal CVD or low pressure CVD (LPCVD) and spin-on methods. Of these methods PECVD having a low frequency plasma component, provided by a low frequency radio-frequency (LFRF) power source, is preferred.

The diffusion barrier layer 309 must adhere to the copper features and the dielectric layers above and below. A more compressive barrier layer has better adhesion between barrier and copper layers and is therefore preferred. Strong adhesion between the barrier and copper layers reduce the likelihood of copper diffusion and electromigration, both causes of subsequent device failure. The presence of bonded hydrogen in the film has been recognized as the major source of compressive residual stress. The presence of hydrogen reduces the nominal spacing between the molecules and generates compressive stress.

Referring again to FIG. 3B, a first dielectric layer 311 of a dual damascene dielectric structure is deposited on a diffusion barrier 309. This dielectric layer 311 may be a porous ultra low-k (ULK) dielectric layer as discussed above, or a moderately low-k dielectric layer. A range of materials may be used as dielectric layer 311, from ULKs such as porous MSQ (methyl silsesquioxane) and CORAL, to moderately low-k films such as CDO (carbon doped oxide) and FSG, and finally to the conventional silicon dioxide. Two example dielectric materials, the porous ULK film and the FSG film, are discussed below to illustrate example UV radiation treatments.

Porous ULK Dielectric Film

Dielectric layer 311 may be an ultra low-k dielectric film formed with a structure former and a pore generator (porogen). In some methods, the structure former and porogen are co-deposited in one process. In alternative methods, the structure former and porogen are deposited separately in a two-phase process. Depending on the application, the thickness of the film may range between about 15 nanometers and 3 micrometers.

The porogen may be removed from the precursor film by a UV radiation treatment. In a first approach, the UV light directly interacts with the porogen to chemically decompose or otherwise modify the porogen and produce products that are more easily removed than the porogen itself. In general, the UV radiation is tuned for absorption by the porogen. Thus, the UV radiation preferably has a high intensity component at a wavelength (or range of wavelengths) at or near an absorption peak of the porogen. Of course, the porogen may be chosen to match the characteristics of an available UV source.

After the porogen removal operation, the film is typically soft and compliant. The UV radiation treatment is continued to increases the hardness and/or modulus of the film. This cross-linking operation is believed to increase the number of crosslinks (i.e., the number of covalent bonds) within the dielectric film, thereby increasing the film hardness. Measures of film hardness and modulus presented herein may be made with any suitable apparatus including nano-indenter device.

UV intensity may be higher during cross-linking than during porogen removal. UV exposure time is largely a function of both the lamp intensity and the density of the precursor layer including porogen and structure former. UV exposure times range from seconds to tens of hours. Preferably, for commercial applications, the exposure time will be about 5 minutes or less. In a preferred embodiment, the exposure time ranges from about 1 second up to 5 minutes. The wavelengths in the UV spectral profile may be different during cross-linking than during porogen removal, for example, cross-linking is favored for UV wavelengths of 220-250 nm.

FSG Dielectric Film

Dielectric layer 311 may also be a fluorosilicate glass (FSG) dielectric layer. FSG can be deposited with conventional plasma enhanced CVD (PECVD) and high-density plasma CVD (HDP-CVD) processes that have been widely used for depositing undoped silicate glass (USG) in aluminum or tungsten/aluminum interconnects.

FSG film may be treated with UV radiation to improve stability. UV exposure removes the loosely bound fluorine and/or the silanol that is formed from the exposure of an unstable FSG film to moisture. Silanol is formed when water ($H_2O$) cleaves an Si—F bond in the SiOF film. The resulting Si—OH increases the dielectric constant of the film and the byproducts of the reaction, H, F, and/or HF cause adhesion issues within the device structure (blistering, delamination), especially when the device is heated in subsequent processes. The UV exposure may also remove other defects in the SiOF film, such as Si—H and dangling (unsatisfied) bonds. It is believed that UV exposure also results in cross-linking in the Si—O matrix, further enhancing the film's stability.

The UV exposure may be conducted in a partial pressure of a reactive gas that participates in the removal of loosely bound fluorine and Si—OH. An appropriate gas may be hydrogen. In the presence of a high intensity UV source, hydrogen assists in removing loosely bound or free fluorine by the reaction F+H→HF and in removing silanol by the reaction H+OH→$H_2O$ (these reactions assume that $H_2$+UV radiation→2H). At elevated temperatures above the ambient (e.g., up to 400 or 450° C.) and at reduced pressure less than one atmosphere the HF and $H_2O$ are evolved out of the film and pumped away.

Effect of UV Treatment on Underlying Diffusion Barrier Layer

As discussed above, dielectric layer 311 may be treated with UV radiation to effect certain desired changes in properties. During UV treatment of the overlying dielectric layer 311, the underlying dielectric diffusion barrier 309 is also exposed to UV radiation. Depending on the thickness and optical properties of the overlying dielectric film to be treated, differing amounts of UV radiation would penetrate to and interact with the dielectric diffusion barrier film below. For the sample dielectric layers 311 discussed above, significant amounts of UV radiation would penetrate to the diffusion barrier layer.

The UV radiation interacts strongly with the underlying dielectric diffusion barrier film. UV radiation breaks Si—H and Si—OH bonds in the diffusion barrier film and allows the hydrogen to diffuse out of the film. As the hydrogen and the hydroxyl in the silicon matrix are removed, the spacing between the molecules is increased. The increasing in molecule spacing causes the film to become more tensile. Thus, as result of the UV radiation, the dielectric diffusion barrier film stress shifts. The stress shift may be from more compressive to less compressive, but also may be from compressive to tensile.

The stress shifts from compressive to tensile for the dielectric diffusion barrier films can lead to reliability issues. The dielectric diffusion barrier film is a part of the film stack: copper interconnect layers in trenches and via surrounded by a dielectric film lays below; and another dielectric film, such as the porous ULK, lays on top. A stress shift may affect the adhesion between copper and the dielectric diffusion barrier layer on one side or the overlying dielectric layer and the diffusion barrier layer on the other side. A large stress shift can cause the diffusion barrier layer to delaminate from the rest of the film stack. A significant stress shift may cause the adhesion at either interface to become weak, and such weak interface may be a source of device failure after subsequent processing or during device operation. Weakness at the barrier-copper interface may allow copper diffusion and electromigration. The present invention is directed to reduce this stress shift so as to maintain the integrity of the film stack.

The Damascene Process Continues

After the dielectric layer 311 is deposited and treated, deposition of an etch stop layer 313 follows, using a PECVD, CVD (thermal or LPCVD) or a spin-on method. The layer is deposited on a surface of dielectric 311 that does not include exposed metal lines. Note that layers 311 and 303 need not necessarily have identical composition. Similarly, etch stop layer 313 is preferably a layer of low-k material but need not necessarily have an identical composition to layer 309.

Figure 3C:
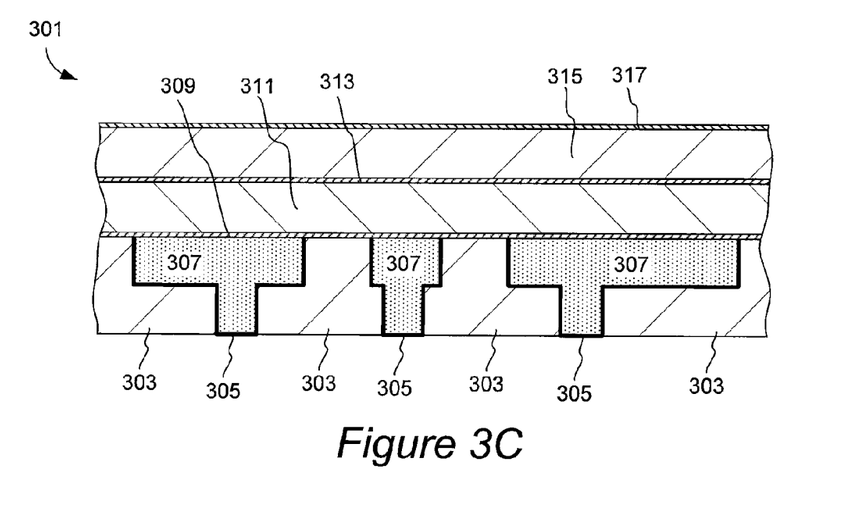

The process follows, as depicted in FIG. 3C, where a second dielectric layer 315 of the dual damascene dielectric structure is deposited in a similar manner to the first dielectric layer 311, onto etch-stop layer 313. Deposition of a CMP stop layer 317 follows. Second dielectric layer 315 is typically a low-k dielectric material such as those described above for layers 303 and 311. A CMP stop layer 317 serves to protect the delicate dielectric material of IMD layer 315 during subsequent CMP operations. Typically, a CMP stop layer is subject to similar integration requirements as diffusion barrier and etch stop layers 309 and 313.

Figure 3D:
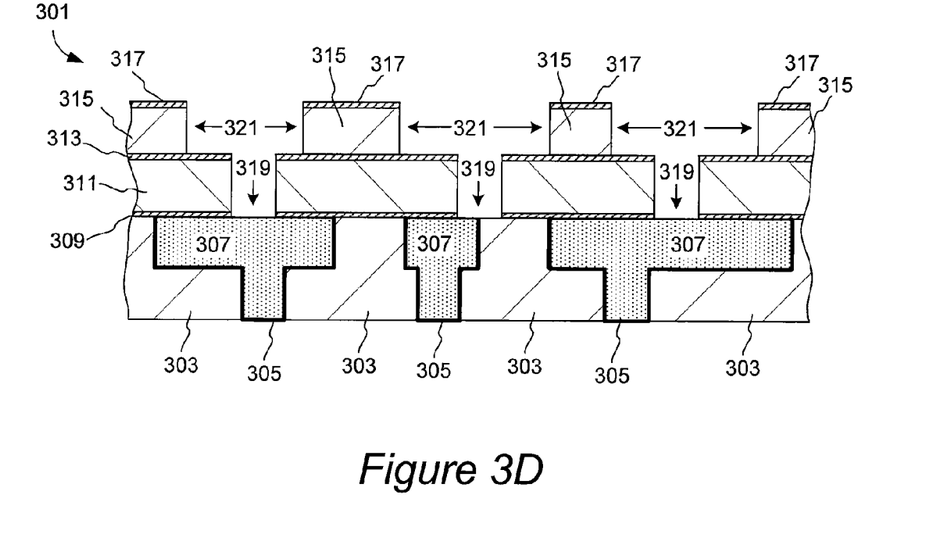
Figure 3E:
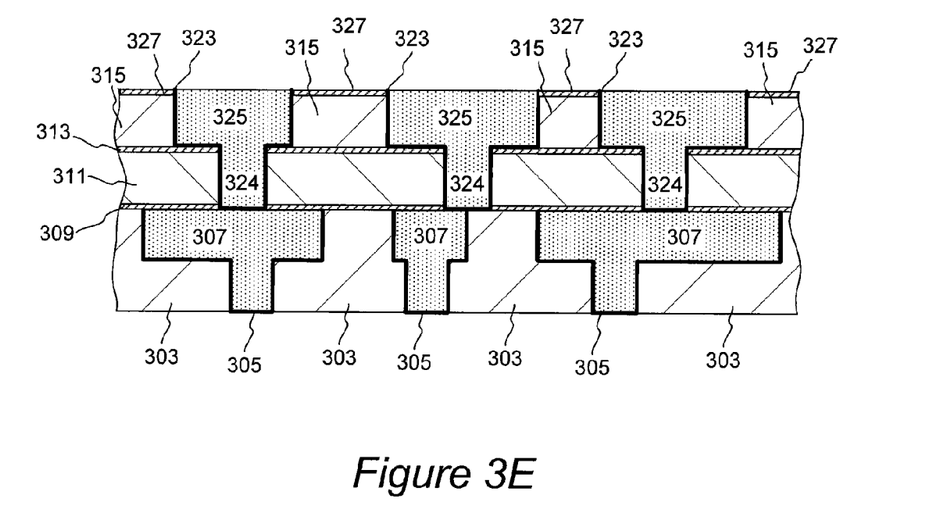

As depicted in FIGS. 3D-3E, next vias 319 and trenches 321 in the first and second dielectric layers are etched. Standard lithography techniques are used to etch a pattern illustrated in FIG. 3D. Trench-first or via-first methods, well known to those of skill in the art, may be employed. Next, as depicted in FIG. 3E, these newly formed vias and trenches are coated with a metal diffusion barrier 323. As mentioned above, barrier 323 is made materials that effectively block diffusion of copper atoms into the dielectric layers.

After diffusion barrier 323 is deposited, a seed layer of copper is applied followed by electrofilling with copper. Excess metal deposited in the field is removed in a CMP operation. FIG. 3E shows the completed dual damascene process, in which copper conductive routes 324 and 325 are inlayed (seed layer not depicted) into the via and trench surfaces over barrier 323.

Performance characteristics that are important for materials used in etch-stops, copper diffusion barriers and other similar layers, will be presently described.

Integration Requirements

Barrier and etch stop layers, such as layers 309 and 313 shown in FIG. 3E should not only possess a low dielectric constant in order to minimize the effective dielectric constant of an IMD stack, but should preferably meet a number of integration requirements. These requirements relate to stability of these layers, their mechanical strength, their stress characteristics and their electrical performance.

Stability of the film may be assessed by measuring its properties immediately after the film has been deposited and after the deposited film has been exposed to ambient environment and subsequent semiconductor processing such as deposition and UV treatment of an overlying dielectric layer. The difference between these two values is a measure of stability of the film with respect to the measured parameter. Dielectric constant shift and stress shift are two important stability characteristics that will be discussed presently in detail.

Stability of the film can be assessed with regard to stress parameters of the film. It is preferable that residual stress of the deposited film does not substantially change over time. Large stress shifts may be associated with cracking of the film or delamination of the film from the underlying substrate. Barrier films having stress shift of less than about 50 MPa are typically considered suitable for integration.

In addition to the stress shift parameter, the absolute value of residual stress is an important integration characteristic. Residual stress is comprised of an extrinsic stress component and an intrinsic stress component. Further, residual stress can be either compressive or tensile. Compressive stress pushes the film out (along the plane of the film) and causes it to bend the underlying substrate so that it is convex. Tensile stress pushes the film inward causing the underlying substrate to adopt a concave shape. A film of excessive tensile stress tends to initiate cracking spontaneously or under external influence. Further, the tensile stress tends to propel the crack propagation in the film.

Compressive and tensile stresses are measured on one scale with positive values corresponding to tensile stress and negative values corresponding to compressive stress. On this scale, higher compressive stress is characterized by lower negative values, while higher tensile stress is characterized by higher positive values. Films having no residual stress correspond to zero on this scale. Conventional low-k ILD layers (k<3.2), typically have a tensile stress in excess of 50 MPa. While generally an etch stop or barrier layer is compressive, more compressive films are strongly preferred for these types of applications because a more compressive barrier layer has better adhesion between barrier and copper layers. In addition, compressive stress also can offset tensile stress in an underlying layer. However, compressive stress generally decreases (becomes less compressive) with decreasing k. For example, compressive stress values lower than −100 MPa are hard to achieve for conventionally prepared barrier materials with k of 3.5. This leads to increased possibility of cracking, especially in a multi-layer stack that has several highly tensile layers deposited on top of one another, and may ultimately lead to device failure.

Stability of the film can be assessed with regard to the film hermeticity, or the ability to prevent moisture from penetrating into the film. When exposed to ambient environment containing atmospheric moisture, the barrier or etch stop film may absorb water contained in the air. Hygroscopic films that absorb large amounts of moisture are typically not suitable for use as barrier layers and etch stops in IC fabrication. Absorbed water may dramatically increase dielectric constant of the film to values that may not be acceptable for integration with low-k dielectric, even if the film has a low dielectric constant immediately upon deposition. Further, absorbed moisture will negatively affect the underlying dielectric layers and metal lines on which the film has been deposited, since it will increase the k value of low-k ILD and may contribute to oxidation of copper in the copper lines to copper oxide.

It is desirable that diffusion barriers and hard masks, do not absorb substantial amounts of moisture. Preferably, these films should have high stability in terms of their dielectric constants. For example, as provided in some embodiments described herein, materials having a dielectric constant shift (k shift) of less than about 0.15, preferably less than about 0.10 when measured after 96 hours under ambient conditions, meet this integration requirement. For example, films having a k shift value of less than 0.1 are considered to be stable.

Integration requirements that relate to mechanical strength of the film demand that an etch-stop or barrier material possesses high hardness and modulus values. A desirable modulus range is about 20 to 30 GPa. Desirable hardness values for the films described herein are at least about 4 GPa, preferably between about 5 and 10 GPa.

The diffusion barrier layer must meet these integration requirements as formed and as after subsequent processing. Because interaction with UV radiation adversely affect its ability to meet these integration requirements, the amount of UV radiation absorbed by the diffusion barrier layer must be limited. The UV radiation absorbed should be limited to the point where the adverse interaction effect no longer impacts the ability to meet integration requirements. The reduction in absorption may be accomplished by changing the optical properties of the diffusion barrier film or by adding a layer with specific optical properties.

Forming a Diffusion Barrier Film with Low Extinction Coefficients

As discussed above, a diffusion barrier film with a low extinction coefficient would absorb less UV radiation than a film with higher extinction coefficient. Of course, the lower extinction coefficient film still must meet integration requirements.

Diffusion barrier film can be formed in a PECVD chamber that has the capability to generate a plasma with a high frequency radio frequency source (HF RF), typically with a frequency of about 1 MHz-30 MHz, commonly at 13.56 MHz and 27 MHz. Optionally, a low frequency radio frequency source (LFRF) may be used to direct the plasma toward the substrate surface on the pedestal. LFRF is typically 100 kHz to 500 kHz, commonly at 400 kHz. The substrate is contacted with a process gas that contains the necessary precursors of a diffusion barrier film. The precursors may be one or many, and may be gaseous or be liquids or solids carried by carrier gases as aerosols or suspensions.

Tests were conducted to find one or more variables that would yield a diffusion barrier film with a lower extinction coefficient. In one test, two films were created using the same precursors and process parameters, except for LFRF. In one film the LFRF power was off, so the plasma was not directed toward the substrate surface on the pedestal. Both films were 500 angstroms thick and comprised of SiNC. The extinction coefficients were measured. The film deposited without LFRF had a lower extinction coefficient.

Tests were further conducted to ensure that the lower extinction coefficient film would have a lower stress shift after UV exposure. Both films were exposed to UV radiation for 12 minutes. The film stress was measured before and after the UV exposure. The results are listed in Table 2.

TABLE 2

Test Results of k(extinct) and Stress Change after UV Exposure

| Film | 500A @ 248 nm | | Stress (MPa) | | Stress change (MPa) |
|---|---|---|---|---|---|
| | n | k | Pre-UV cure | Post UV cure | |
| NDC-294 | 2.09 | 0.2297 | −290 | 297 | 587 |
| NDC-294, No LFRF | 2.08 | 0.1533 | −147 | −103 | 44 |

Test data shows that the extinction coefficient was reduced from 0.2297 to 0.1533. This reduction of k(extinct) can reduce the UV absorption at 248 nm by about 30%. The residual compressive stress in the lower k(extinct) film was almost half of the residual compressive stress in the higher k(extinct) film (−290 MPa as compared to −147 MPa). After UV exposure, however, the stress in the lower k(extinct) remained compressive, thereby maintaining the integrity of the would-be film stack. The more residual compressive film with higher extinction coefficient had a very large stress shift, such that the film became tensile after UV exposure. This kind of large stress shift is what the present invention aims to avoid because it may cause integration and reliability issues.

Therefore, a diffusion barrier layer having an extinction coefficient between about 0.1 and 0.2, preferably below 0.15 is preferred in this context. At k(extinct) of 0.15 and below, the stress shift induced by subsequent UV radiation treatment of an overlying dielectric layer is small enough to not cause integration and reliability issues.

The test showed that diffusion barrier films with low extinction coefficients absorb less UV radiation, and the film stresses shifted less after UV exposure as a result. This test was conducted comparing the difference between films deposited with and without LFRF power, but the invention in not so limited. One skilled in the art would be able to vary other process parameters to achieve the same result. For example, similar results may be obtained with low LFRF power or with a lower precursor flowrate for a longer duration. Si—H was found to be more reactive during UV cure than C—H or N—H bonding. With the minimal Si—H in the dielectric film, the UV induced stress change can also be reduced.

Adding a Capping Layer with Desired Optical Properties

In some embodiments, adding a capping layer with desired optical properties reduces the UV radiation transmitted to the diffusion barrier layer. A capping layer that does not substantially transmit UV radiation may be added. Such capping layers may be highly absorbing or highly reflective.

A highly absorbing layer may absorb half or more of the UV radiation incident on the layer. Table 1 shows various thicknesses required to absorb 50% of the UV intensity for different extinction coefficients (k(extinct)). The absorbing layer may comprise SRO, SiON or SiN. Generally, a good absorbing layer would have relative high k(extinct) so as to require less thickness, but still have good dielectric qualities to be in the film stack.

In one example, a silicon nitride film was deposited on top of a SiCN film. The silicon nitride was deposited in a PECVD chamber, with pressure at about 3 Torr, and reactant gases of $SiH_4/NH_3$ or $4MS/NH_3$. A film thickness of 300 angstroms was obtained. The film stresses of the SiCN were measured as deposited both with and without a SiN cap. UV radiation was applied to both films at for 12 minutes. Then the film stresses was measured after the UV treatment.

Figure 4:
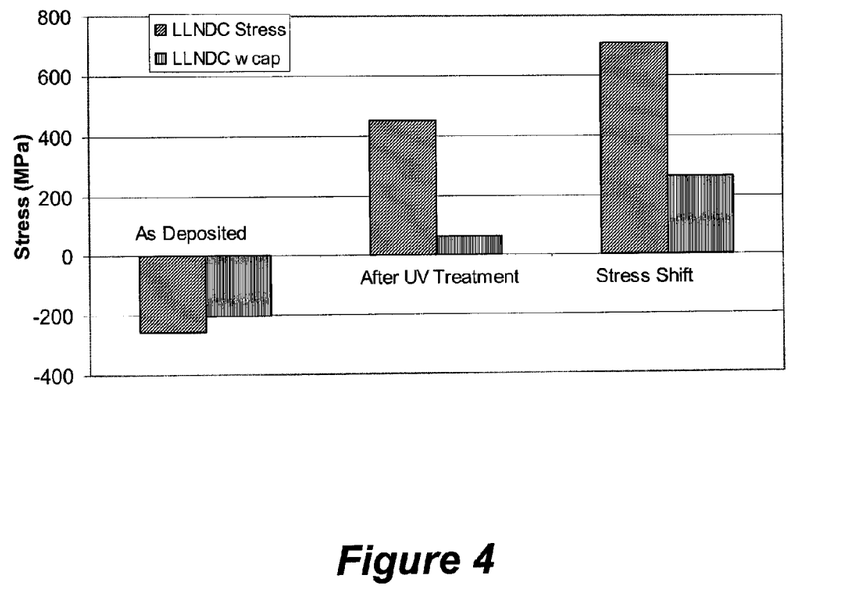
FIG. 4 shows film stresses for SiCN films with and without a capping layer before and after UV exposure.

The results are shown in FIG. 4. Both SiCN films as deposited had residual compressive stress. The uncapped film has slightly more residual compressive stress. After UV treatment, both films became tensile, but to very different degrees. The uncapped SiCN film stress became about 453 MPa, but the capped SiCN film stress was about 60 MPa. Without a capping layer, the film had stress shift of more than 700 MPa. With a capping layer, the film had stress shift of only about 260 MPa.

The results show that the SiCN film stress shift was greatly reduced with the addition of a capping layer. The capping layer absorbed the UV radiation and reduced the interaction between the diffusion barrier layer and the UV. Given the direction provided herein, one skilled in the art would be able to fine-tune the thickness and the extinction coefficient of the absorbing capping layer to achieve required UV absorption.

Another capping layer that would limit the transmission of UV radiation is a highly reflective layer. Reflections from the top and bottom interfaces are made to constructively interfere with each other. Highly reflective layers are generally made of alternating layers of materials having high and low refractive index. Larger refractive index differences result in more reflected light. The number of layer pairs also increases the total reflectively. In order for the reflected waves to interfere constructively, the reflection from the bottom interface should be one wavelength apart from the reflection from the top interface. In cases where the surface material has a higher index of refraction, the light reflected at the surface changes phase 180 degrees. If the light changes phase at one surface but not another, the thickness between the top and bottom of the surface should be about one quarter of the wavelength of incident light, in that medium, for maximum reflectivity. If the phase change is the same at both surfaces, then the thickness required for maximum reflectivity is about ½ of the wavelength of incident light.

By choosing materials of appropriate refractive indexes thicknesses in layers and taking into account any phase change at the boundary, the reflections from the top and bottom surfaces can be made to be multiples of wavelengths apart and thus highly reflective. Because the UV radiation typically used in semiconductor processing comprises a range, a number of layers at different one-quarter or one-half thicknesses may be required to reflect UV radiation having a range of wavelengths. But having multiple layers means multiple deposition processes, which increases queue time, equipment and material usage, and sources of defects.

As noted above, one way to restrict the number of reflecting layer pairs is to apply UV radiation in a narrow band. It is found that specific reactions occur with certain UV wavelengths. For example, cross-linking of ULK film occurs at about 220-260 nm, and porogen removal occurs at 250-270 nm. Using UV radiation in a narrow band means fewer number of layers would be required to achieve the constructive interference discussed above. A monochromatic UV radiation source such as a laser or a semi-monochromatic, with full wave half wave (FWHW) of about 20 nms, may be used. In the case of monochromatic radiation source, only one capping layer is required for the reflected wavelengths to constructively interfere.

In particular embodiments, the highly reflective capping layer may be a dielectric film layer having a refractive index of 2.5 or above. The thickness of the highly reflective layer may be about 65 nm. Using a highly reflective layer as the capping layer has the advantage of directing the UV back toward the overlying dielectric film where the UV treatment would continue. In this case, the top surface would be the interface between the ULK film and the highly reflective capping layer and the bottom surface would be the interface between the capping layer and the diffusion barrier layer. Radiation changes phase at the top surface because the capping layer has a higher refractive index than the ULK film. Radiation would not change phase at the bottom surface if the diffusion barrier layer has a lower refractive index. Thus, a capping layer of thickness at about ¼ of the wavelength of the incident light may be used to obtain maximum reflectivity.

Of course, the capping layer may be both absorbing and highly reflective. Highly absorbing layers require a high extinction coefficient. Highly reflective layers requires a large difference in refractive index between the layer pairs. Given the direction provided herein, one skilled in the art may balance these variables and find suitable materials that can perform both functions. A capping layer that is both absorbing and reflective would be highly effective.

The present invention can be implemented in many different types of apparatus, such as chemical vapor deposition (CVD) reactors and spin-coating systems. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In one embodiment, a wafer undergoing dielectric deposition is transferred from one station to another within the reactor during the process. While in process, each wafer is held in place by a pedestal, wafer chuck and/or other wafer holding apparatus. For certain operations in which the wafer is to be heated, the apparatus may include a heater such a heating plate. In a preferred embodiment of the invention, a PECVD (Plasma Enhanced Chemical Vapor Deposition) system may be used as well as, for example, an HDP CVD (High Density Plasma Chemical Vapor Deposition) system.

A suitable semiconductor processing tool may be the Novellus Vector™ tool having a 4-station deposition scheme may be used. In other embodiments, the Novellus Speed™ tool may be used. These tools are produced by Novellus Systems of San Jose, Calif. Although the discussion above described a multi-station reactor, note that the invention may be implemented on a multi-station tool or a single wafer chamber tool. In a single wafer chamber implementation, the wafer may be subjected to the methods of this invention in the same chamber, or different operations may be performed in different chambers.

It is understood that the examples and embodiments described herein are for illustrative purposes only and that various modifications or changes in light thereof will be suggested to persons skilled in the art. Although various details have been omitted for clarity's sake, various design alternatives may be implemented. Therefore, the present examples are to be considered as illustrative and not restrictive, and the invention is not to be limited to the details given herein, but may be modified within the scope of the appended claims. For example, while applications of UV-resistant diffusion barrier layers have been described, it is understood that the use of a UV-resistant layer is not limited to these applications, and may include use as inter-layer dielectric material or other use that may be found suitable by those of skill in the art.

What is claimed is:

1. A semiconductor processing method, comprising:
providing a modified diffusion barrier film that is constituted to substantially prevent absorption of UV radiation, said modified diffusion barrier film having a substantially uniform composition;
depositing a dielectric directly on the barrier film;
treating the dielectric with UV radiation, wherein the UV radiation alters the dielectric film properties.

2. The method of claim 1, wherein the UV treating operation alters film stress of the diffusion barrier film by less than 50 MPa.

3. The method of claim 1, wherein the modified diffusion barrier film has an extinction coefficient between 0.1 and 0.2.

4. The method of claim 1, wherein the modified diffusion barrier film has an extinction coefficient less than 0.15.

5. The method of claim 1, wherein the modified diffusion barrier film is deposited by a plasma-enhanced chemical vapor deposition process without applying LFRF power.

6. The method of claim 1, wherein the modified diffusion barrier film is selected from a group consisting of $Al_2O_3$, $TiO_2$, SiC, SiCN, SiN, and SiOC.

7. A semiconductor processing method, comprising:
providing a diffusion barrier film;
providing a capping layer on top of the diffusion barrier film, wherein the capping layer is selected from the group consisting of a silicon-rich oxide (SRO), a silicon oxynitride (SiON), and a silicon nitride (SiN);
depositing a dielectric on the capping layer;
treating the dielectric with UV radiation, wherein the UV radiation alters the dielectric film properties and not substantially alter the diffusion barrier film properties.

8. The method of claim 7, wherein the capping layer absorbs, reflects, or both absorbs and reflects incident UV radiation.

9. The method of claim 7, wherein the diffusion barrier film is a modified diffusion barrier film constituted to substantially prevent absorption of UV radiation.

10. The method of claim 7, wherein the capping layer absorbs, reflects, or both absorbs and reflects incident UV radiation; and, wherein the diffusion barrier film is a modified diffusion barrier film constituted to substantially prevent absorption of UV radiation.

* * * * *